(12) United States Patent
Whitton

(10) Patent No.: US 7,479,020 B2
(45) Date of Patent: Jan. 20, 2009

(54) ELECTRONIC CONTROL MODULE HAVING AN INTERNAL ELECTRIC GROUND

(75) Inventor: David M. Whitton, Saline, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 333 days.

(21) Appl. No.: 10/994,696

(22) Filed: Nov. 22, 2004

(65) Prior Publication Data

US 2006/0111832 A1 May 25, 2006

(51) Int. Cl.
H01R 4/58 (2006.01)

(52) U.S. Cl. .................. 439/101; 439/493; 439/108; 439/83; 439/573; 361/719; 361/712

(58) Field of Classification Search .......... 701/100; 361/719, 720, 728, 730, 736, 701, 785, 780, 361/752, 712, 723, 727; 439/76.1, 83, 573, 439/571, 271, 493, 669, 101, 380, 108; H01R 4/58
See application file for complete search history.

(56) References Cited

U.S. PATENT DOCUMENTS

| | | | |
|---|---|---|---|
| 3,258,649 A | 6/1966 | Arguin et al. | 301/807 |
| 3,511,385 A | 5/1970 | Ayling | 211/41.17 |
| 3,576,515 A | 4/1971 | Frantz | 439/267 |
| 3,662,224 A | 5/1972 | Rauch | 361/741 |
| 3,838,777 A | 10/1974 | Thornicroft et al. | 211/41.17 |
| 3,852,643 A | 12/1974 | Seki et al. | 361/709 |
| 3,975,805 A | 8/1976 | Spurling et al. | 403/374.3 |
| 4,002,953 A | 1/1977 | Tetlie | 361/756 |
| 4,072,234 A | 2/1978 | David | 211/41.17 |
| 4,201,303 A | 5/1980 | Smith | 211/41.17 |
| 4,475,145 A | 10/1984 | Heil et al. | 361/720 |
| 4,486,816 A | 12/1984 | Hope | 361/756 |
| 4,701,829 A | 10/1987 | Bricaud et al. | 361/721 |
| 4,853,828 A | 8/1989 | Penn | 361/717 |
| 4,979,073 A | 12/1990 | Husted | 361/721 |
| 5,171,293 A * | 12/1992 | Umemoto et al. | 439/620.33 |
| 5,521,792 A * | 5/1996 | Pleitz et al. | 361/715 |
| 5,581,130 A * | 12/1996 | Boucheron | 307/10.1 |
| 5,712,765 A * | 1/1998 | Lehrmann et al. | 361/704 |
| 5,835,349 A * | 11/1998 | Giannatto et al. | 361/701 |
| 5,892,660 A * | 4/1999 | Farnworth et al. | 361/728 |
| 5,915,463 A * | 6/1999 | Romero et al. | 165/80.3 |

(Continued)

Primary Examiner—Tuan C To
(74) Attorney, Agent, or Firm—Brinks Hofer Gilson & Lione

(57) ABSTRACT

An electronic control module for electrical components of a vehicle. The electronic control module has an internal electrical ground. The module comprises a housing having an open end and a side wall extending from the open end. The side wall has a slot formed along the side wall. The module further comprises a printed circuit board disposed within the slot. The printed circuit board has a solder pattern disposed thereon, wherein at least a portion of the solder pattern is adjacent the open end and aligned with the slot. The module further comprises an end plate attached to the open end of the housing to enclose the printed circuit board therein. The end plate has an aperture being aligned with the slot of the housing. The module further comprises an attachment member disposed through the aperture in the slot. The attachment member is in contact with the portion of the solder pattern and with the side wall to provide an electrical ground for the printed circuit board.

14 Claims, 5 Drawing Sheets

U.S. PATENT DOCUMENTS

| | | | |
|---|---|---|---|
| 6,104,615 A * | 8/2000 | Pohl et al. ................... 361/719 |
| 6,116,921 A * | 9/2000 | Scholz et al. ................. 439/83 |
| 6,126,458 A * | 10/2000 | Gregory et al. ............ 439/76.2 |
| 6,176,536 B1 * | 1/2001 | Miller et al. ............... 296/37.7 |
| 6,280,202 B1 * | 8/2001 | Alden et al. ................. 439/66 |
| 6,362,969 B1 | 3/2002 | Furst et al. ................. 361/752 |
| 6,502,297 B2 | 1/2003 | Giese et al. ................. 291/557 |
| 7,011,533 B2 * | 3/2006 | Miyamoto ................... 439/95 |
| 7,050,305 B2 * | 5/2006 | Thorum ...................... 361/719 |
| 7,101,198 B2 * | 9/2006 | Listing et al. .............. 439/76.1 |
| 7,227,758 B2 * | 6/2007 | Brandenburg et al. ....... 361/780 |
| 7,413,450 B2 * | 8/2008 | Forman ....................... 439/83 |
| 2002/0013075 A1 * | 1/2002 | Kubo et al. ................. 439/101 |
| 2003/0067751 A1 * | 4/2003 | Skofljanec et al. .......... 361/720 |
| 2004/0212967 A1 * | 10/2004 | Roscoe et al. ............... 361/752 |

* cited by examiner

US 7,479,020 B2

ELECTRONIC CONTROL MODULE HAVING AN INTERNAL ELECTRIC GROUND

BACKGROUND OF THE INVENTION

The present invention relates to an electronic control module having an internal electrical ground.

Electronic control modules are commonly used in various industries. Electronic control modules are used in the automotive industry and more specifically in vehicles to control electrical components within vehicles. For example, an electronic control module may be implemented to control a steer-by-wire system, an amplifier, or a heating and cooling system of a vehicle.

Although current electronic control modules are adequate, improvements may be made. For example, most current extruded electronic control modules require a secondary part and/or a secondary step in establishing an electrical ground to the electronic control module. Typically, a conductive wire is attached to part of the electronic control module, e.g., a printed circuit board, and the conductive wire is attached to another portion of the vehicle to establish an electrical ground. The secondary part and/or secondary step requires added time and cost to the electronic control module.

BRIEF SUMMARY OF THE INVENTION

The present invention generally provides an electronic control module and method of making the electronic control module. The electronic control module of the present invention has an internal electrical ground therein. The electronic control module of the present invention is free of an electrical wire attached thereto to establish an electrical ground. Rather, the electrical ground is established internally within the module during the method of making the electrical control module by using preexisting components, thereby saving time and costs to the electrical control module.

In one embodiment, the electronic control module includes a housing having an open end and a side wall extending from the open end. The side wall has a slot formed along the side wall. The module further comprises a printed circuit board disposed within the slot. The printed circuit board has a solder pattern disposed thereon. At least a portion of the solder pattern is adjacent the open end and aligned with the slot. The module further comprises an end plate attached to the open end of the housing to enclose the printed circuit board therein. The end plate has an aperture being aligned with the slot of the housing. The module further comprises an attachment member, e.g, a threaded screw, disposed through the aperture in the slot. The attachment member is in contact with the portion of the solder pattern and with the side wall to provide a ground for the printed circuit board.

In another embodiment, the housing has an open end and a closed end. The housing includes first and second opposing side walls extending between the open and closed ends. The first side wall has a first slot formed along the first side wall and the second side wall has a second slot formed along the second side wall. The printed circuit board is disposed within the first and second slots. At least a portion of the solder pattern is adjacent the open end and aligned with one of the first and second slots. The end plate has an aperture aligned with the first and second slots of the housing. The attachment member is disposed through the aperture at one of the first and second slots. The attachment member is in contact with the portion of the solder pattern and with one of the first and second side walls for providing a ground for the printed circuit board.

The present invention further provides a method of making the electronic control module. The method comprises providing components of the electronic control module and disposing the printed circuit board within the slot such that at least a portion of the solder pattern is adjacent the open end and aligned with the slot. The method further comprises aligning the end plate to the open end and with the slot of the housing. The method further comprises disposing the attachment member through the aperture to enclose the printed circuit board in the housing and such that the attachment member is in contact with the portion of the solder pattern and with the side wall, providing an electrical ground for the printed circuit board.

Further objects, features, and advantages of the present invention will become apparent from consideration of the following description and the appended claims when taken in connection with the accompanying drawings.

DETAILED DESCRIPTION OF THE INVENTION

The present invention generally provides an electronic control module having an internal electrical ground. Features and embodiments of the present invention provide an electronic control module that is relatively less in weight, costs, and time. Generally, the electronic control module includes a housing and a printed circuit board having a predetermined solder pattern. An attachment member, e.g., a threaded screw, encloses the printed circuit board within the housing is also placed in intimate contact with the solder pattern, thereby electrically grounding the electronic control module. Additionally, the process of making this electronic control module requires less steps, thereby saving time and costs as well.

Figure 1:
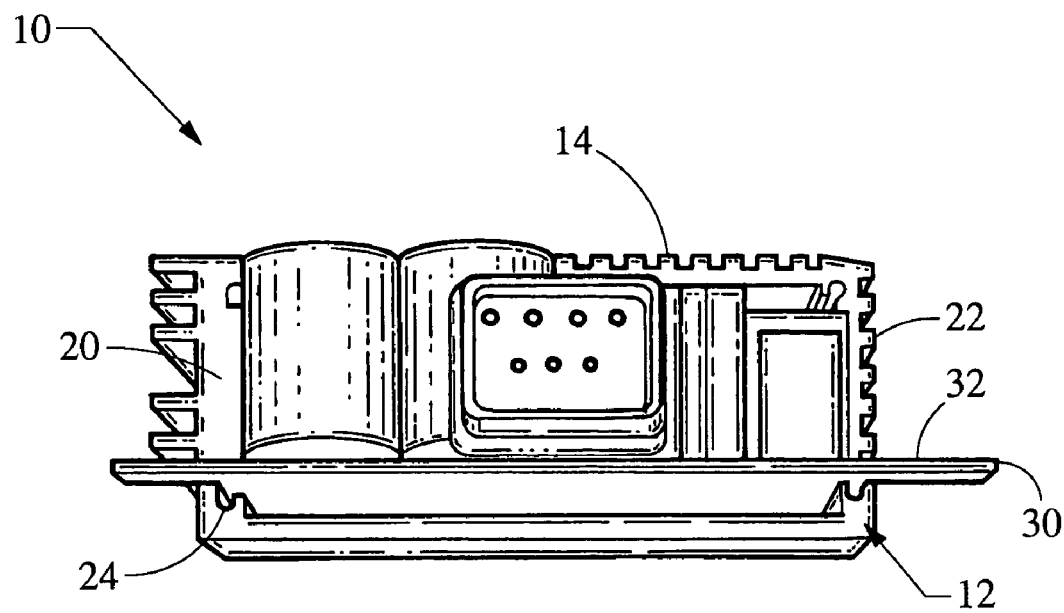
FIG. 1 is a partially exploded view of an electronic control module having an internal electric ground in accordance with one embodiment of the present invention.
Figure 2:
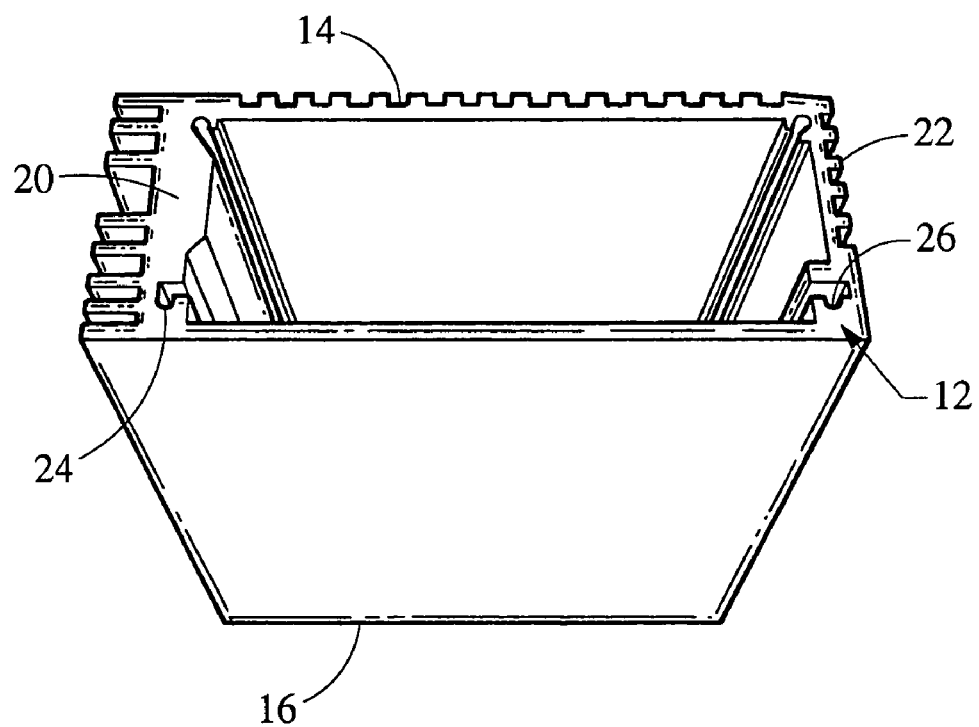
FIG. 2 is a perspective view of one embodiment of a housing of the electronic control module.

FIG. 1 illustrates an electronic control module 10 for electrical components of a vehicle. The electronic control module 10 may be implemented for any electrical component in a vehicle, e.g., an amplifier, a steer-by-wire system, or a heating and cooling system. As shown in FIGS. 1 and 2, module 10 includes a housing 12 having an open end 14 and a closed end

16. In this embodiment, the housing further includes a first side wall 20 and a second opposing side wall 22 extending between the open and closed ends 12, 14.

In this embodiment, the first side wall 20 has a first slot 24 inwardly formed along the first side wall 20 and the second side wall 22 has a second slot 26 inwardly formed along the second side wall 22. As shown, the first slot 24 and the second slot 26 are formed along their respective side walls such that the slots 24, 26 are faced inwardly and in alignment with each other. Preferably, each of the slots 24, 26 are formed along their respective side wall in a C-channel shape. As shown, each of the slots 24, 26 has their respective C-channel shape facing each other inwardly along their respective side wall. As will be discussed in greater detail below, the C-channels receive an attachment member for establishing an internal ground in the module 10.

The housing may be made of any suitable metal or conductive material, e.g., aluminum or aluminum alloy, and may be formed by any suitable means, such as by aluminum extrusion. However, the housing 12 may be made by any other suitable material and by any other suitable means without falling beyond the scope or spirit of the present invention.

Figure 3:
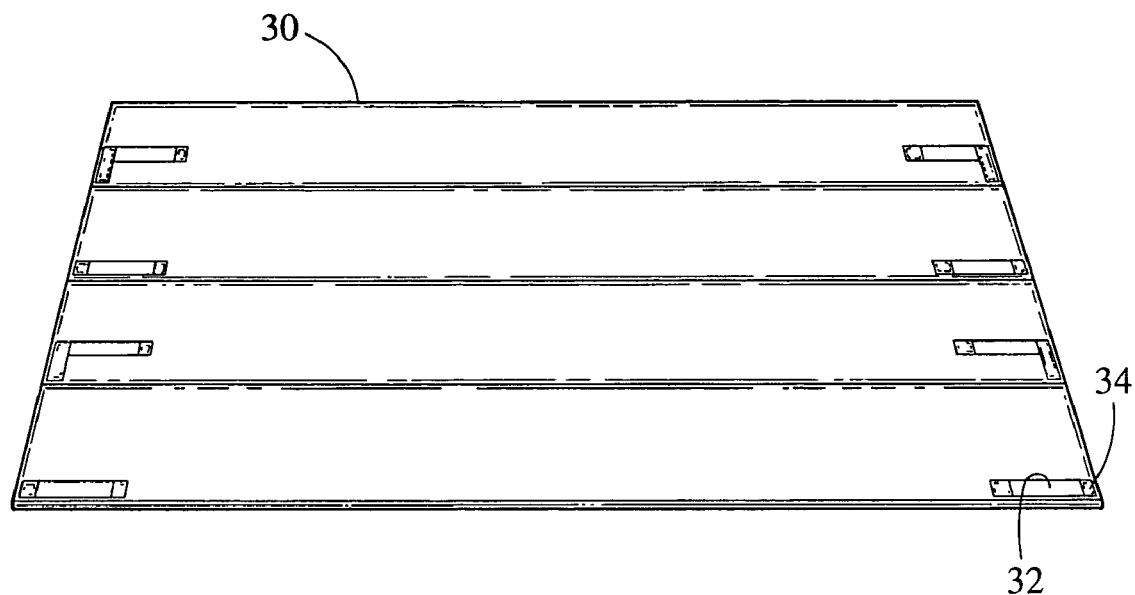
FIG. 3 is a perspective view of a printed circuit board of the electronic control module in accordance with one embodiment of the present invention.
Figure 4:
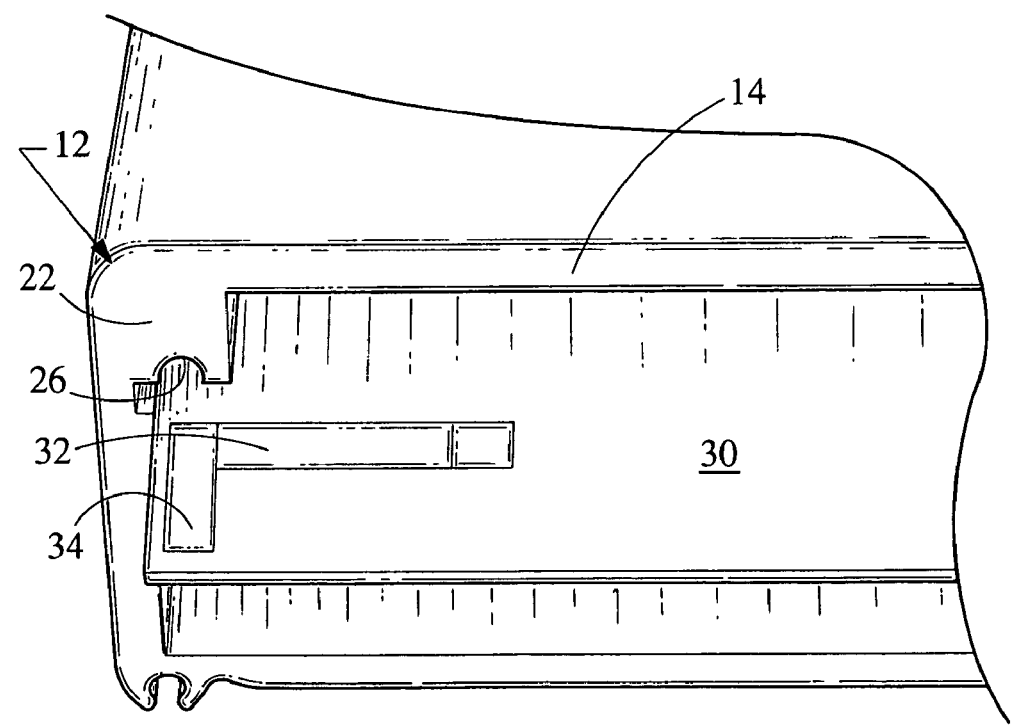
FIG. 4 is a perspective view of the printed circuit board of FIG. 3 disposed within the housing of FIG. 2.

As shown in FIGS. 3 and 4, the module 10 further includes a printed circuit board 30 which is disposed within the housing 12. More particularly, the printed circuit board 30 is preferably configured to be disposed within the first slot 24 and the second slot 26. Preferably, the printed circuit board 30 has a solder pattern 32 and solder mask 33 disposed on a first surface 31 of the printed circuit board 30.

Depending on the desired function of the module, the solder pattern 32, for example, may include PCB components (e.g., resistors, transistor, diodes, thermistor, operational amplifiers) in electrical communication with each other by conductive or copper tracks. The solder pattern 32 may take on any desirable pattern depending on the circuitry of the printed circuit board 30 and the desired function of the module. The solder pattern 32 may be achieved as desired by removing solder mask 33 from the printed circuit board to expose the solder, further defining the solder pattern 32. Undesired areas of the copper and the solder mask may be etched away to form the conductive tracks.

Figure 5:
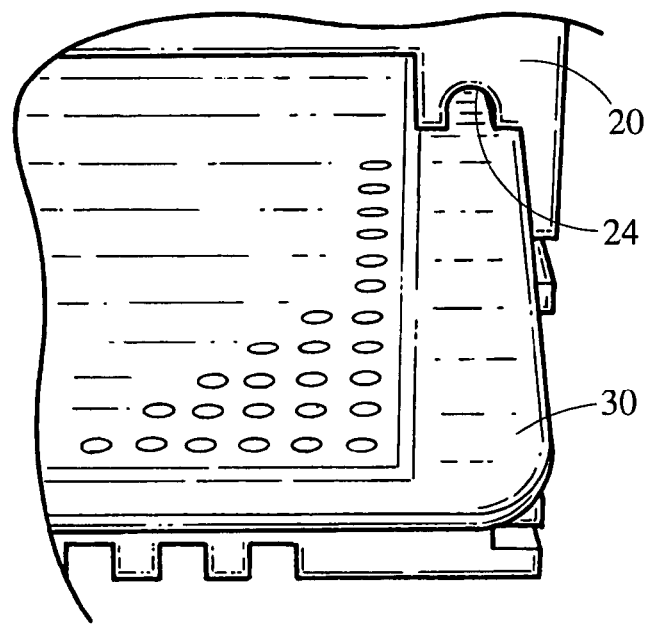
FIG. 5 is another perspective view of the printed circuit board disposed within the housing in accordance with one embodiment of the present invention.
Figure 6:
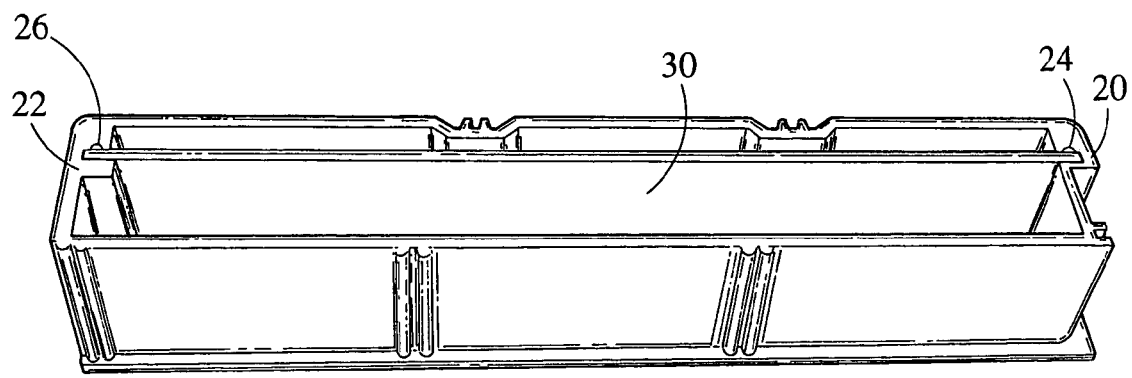
FIG. 6 is a yet another perspective view of one embodiment of the printed circuit board disposed within the housing.

In this embodiment, when the printed circuit board is disposed in the housing 12, the portion 34 of the solder pattern 32 is configured to be adjacent the open end 14 and aligned within one of the first and second slots 24, 26 as shown in FIGS. 5 and 6. As will be discussed in greater detail below, an attachment member, e.g., a threaded screw, is received therein and maintains contact with the housing and the portion 34 of the solder pattern 32. At least the threads of the screw maintain contact with the housing and the portion 34 of the solder pattern 32 to establish an electrical ground.

The printed circuit board 30 may be any suitable printed circuit board or printed wire board. For example, the printed circuit board may be a layer of copper foil glued to a sheet of plastic (referred to as the "substrate"), often with an epoxy glue reinforced with fiberglass. Thus, the printed circuit board may be a laminate made from two or more sheets of material disposed together, such as copper, fiberglass, ceramic, polymeric, and polymer composite materials. The printed circuit board may be formed by removing copper foil to form the conductors (referred to as "traces" or "copper tracks") to which components are attached, usually by soldering. The printed circuit board may be produced by methods known in the art, such as photolithography, PCB milling, and PCB printing, as known.

The printed circuit board of the present invention may be double-sided (with copper tracks on one or both sides) or single-sided depending on the desired function and design of the module. Board components may be disposed thereon by hand or by pick-and-place machines as known, and soldering may be performed by hand or by flow wave soldering wherein the board passes over a wave of molten solder as known.

Figure 7:
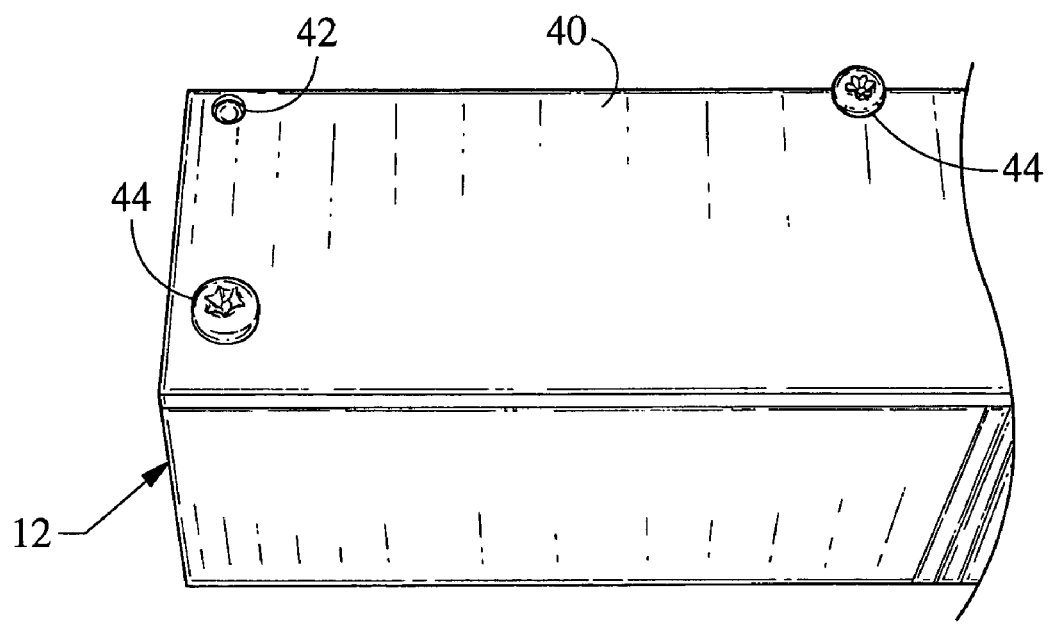
FIG. 7 is a perspective view of an end plate attached to the housing in accordance with one embodiment of the present invention.

FIGS. 1 and 7 depict an end plate 40 attached to the open end 14 of the housing 12 to enclose the printed circuit board 30 therein. As shown, the end plate 40 has apertures 42, each of which is aligned with one of the first slot 24 or the second slot 26 of the housing 12. Preferably, end plate 40 is a metal or conductive material, e.g., aluminum or aluminum alloy.

An attachment member 44, e.g. a threaded screw, is disposed through the aperture 42 at one of the first and second slots 24, 26. In this embodiment, the threaded screws are disposed through the C-channels of either of the slots 24, 26. The attachment member is placed in intimate contact with the housing and with the portion 34 of the solder pattern 32 such that an electrical ground is created. Preferably, the attachment member 44 is a metallic threaded screw that fastens the end plate 40 to the open end 14 of the housing 12.

For example, as shown in FIG. 7, the attachment member 44 is threaded in a portion of slot 24. The attachment member 44 is placed in contact with the portion 34 of the solder pattern 32 and in contact with the housing 12, providing a ground for the printed circuit board 30. The threaded is preferably metallic or conductive to create the internal electrical ground. This feature eliminates the need of attaching a secondary wire to the solder pattern from a contact area to achieve an electrical ground as previously done.

Figure 8:
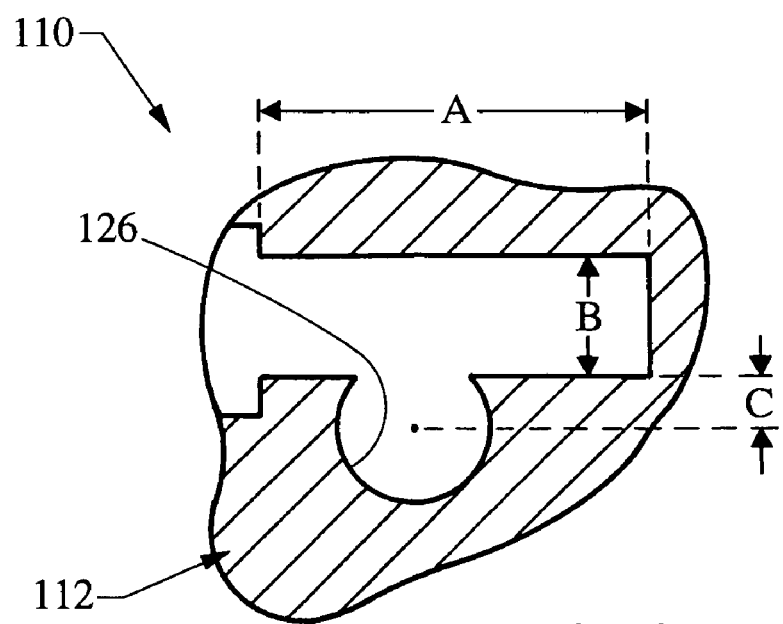
FIG. 8 is a cross-sectional side view of the housing in accordance with another embodiment of the present invention.
Figure 9:
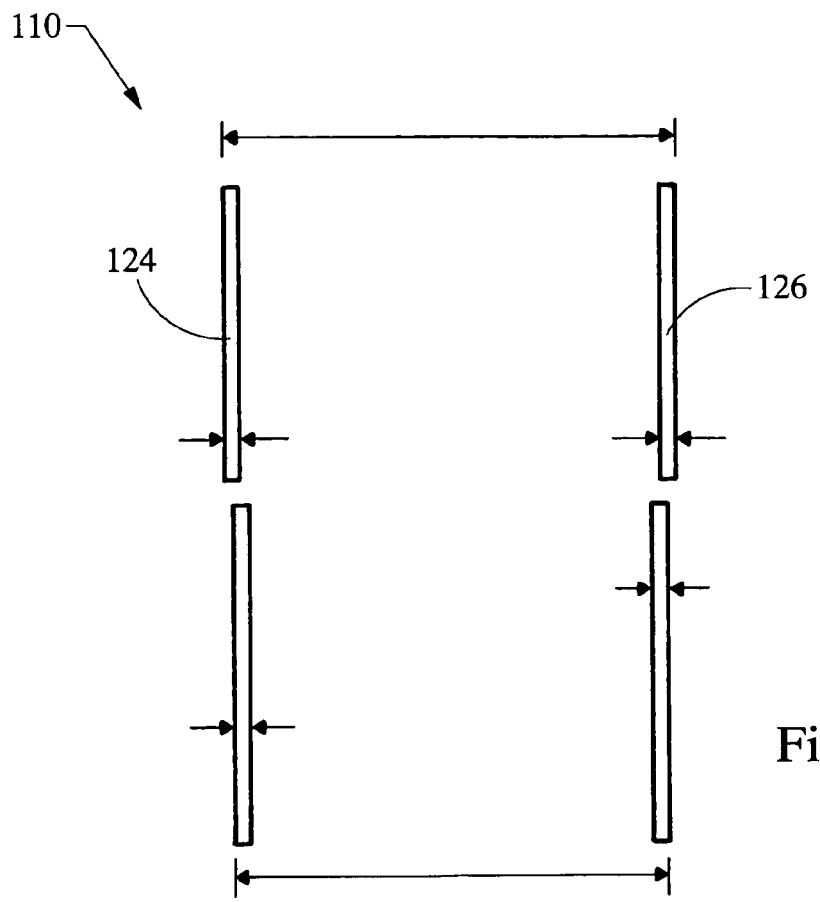
FIG. 9 is a cross-sectional top view of the housing depicting slots formed therealong in accordance with one embodiment of the present invention.

FIGS. 8 and 9 illustrate another example of an electronic control module in accordance with another embodiment of the present invention. In this embodiment, the electronic control module 110 is implemented for an amplifier in a vehicle driver/passenger cabin. As shown, the housing 112 of the amplifier 110 is about 1.7 mm thick with a 2.2 mm slot diameter. In this embodiment, the printed circuit board has a 1.63 mm thickness to allow for the attachment member to be inserted through the slot and be in intimate contact with both the housing and the solder pattern of the printed circuit board.

Figure 10:
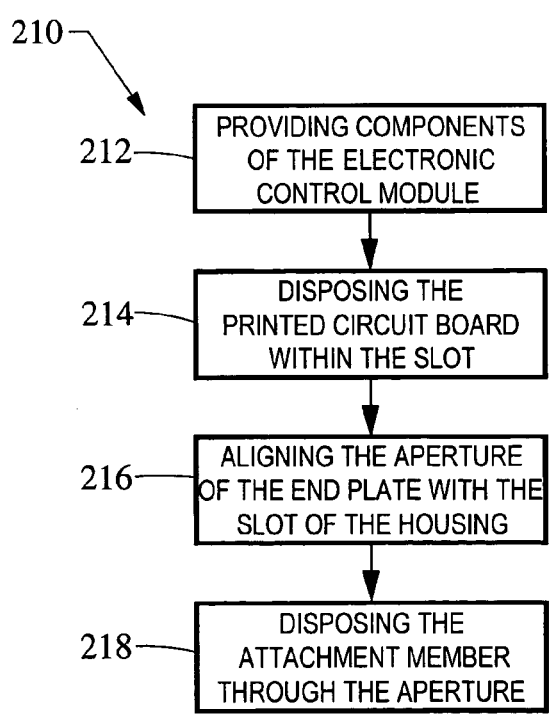
FIG. 10 is a flowchart depicting one method of making the electronic control module.

FIG. 10 illustrates a flow chart depicting one method 210 of manufacturing the electronic control module in accordance with one embodiment of the present invention. As shown, the method 210 comprises providing in box 212 components of the electronic control module which may include: the housing, the printed circuit board, the end plate, and the attachment member. The method further comprises disposing in box 214 the printed circuit board within the slot such that at least a portion of the solder pattern is adjacent the open end and aligned with the slot.

In this embodiment, the method 210 further comprises aligning in box 216 the aperture of the end plate with the slot of the housing. Method further includes disposing in box 218 the attachment member through the aperture to enclose the printed circuit board in the housing. The attachment member is in contact with the portion of the solder pattern and with the side wall to provide an electrical ground for the printed circuit board.

While the present invention has been described in terms of preferred embodiments, it will be understood, of course, that the invention is not limited thereto since modifications may be made to those skilled in the art, particularly in light of the foregoing teachings.

The invention claimed is:

1. An electronic control module for electrical components of a vehicle, the module comprising:
   a housing having an open end and a side wall extending from the open end, the side wall having a slot formed along the side wall;
   a printed circuit board disposed within the slot, the printed circuit board having a solder pattern disposed thereon, at least a portion of the solder pattern being adjacent the open end and received within the slot;
   an end plate attached to the open end of the housing to enclose the printed circuit board therein, the end plate having an aperture being aligned with the slot of the housing; and
   an attachment member disposed through the aperture and in the slot, the attachment member being in contact with the portion of the solder pattern and with the side wall to provide an electrical ground for the printed circuit board.

2. The module of claim 1 wherein the housing member further includes a closed end and the side wall is a first side wall having a first slot formed along the first side wall.

3. The module of claim 2 wherein the housing member further includes a second side wall having a second slot formed along the second side wall.

4. The module of claim 3 wherein the printed circuit board is disposed within the first and second slots.

5. The module of claim 4 wherein the portion of the solder pattern is adjacent the open end and aligned with one of the first and second slots.

6. The module of claim 3 wherein the aperture of the end plate is aligned with one of the first and second slots of the housing.

7. The module of claim 1 wherein the aperture is a plurality of apertures, each aperture being aligned with one of the first and second slots of the housing.

8. The module of claim 1 wherein the slot is a C-channel formed along the side wall.

9. The module of claim 1 wherein the printed circuit board is made of one of the following materials:
   ceramic, polymeric, and polymer composite materials.

10. The module of claim 3 wherein the attachment member is in contact with one of the first and second side walls for providing a ground for the printed circuit board.

11. An electronic control module for electrical components of a vehicle, the module comprising:
    a housing having an open end and a closed end, the housing further including first and second opposing side walls extending between the open and closed ends, the first side wall having a first slot formed along the first side wall and the second side wall having a second slot formed along the second side wall;
    a printed circuit board disposed within the first and second slots, the printed circuit board having a solder pattern disposed thereon, at least a portion of the solder pattern being adjacent the open end and received within one of the first and second slots;
    an end plate attached to the open end of the housing to enclose the printed circuit board therein, the end plate having apertures each being aligned with one of the first and second slots of the housing; and
    an attachment member disposed through the aperture at one of the first and second slots, the attachment member being in contact with the portion of the solder pattern and with one of the first and second side walls for providing a ground for the printed circuit board.

12. The module of claim 11 wherein the aperture is a plurality of apertures, each aperture being aligned with one of the first and second slots of the housing.

13. The module of claim 11 wherein the slot is a C-channel formed along the side wall.

14. The module of claim 11 wherein the printed circuit board is made of one of the following materials:
    ceramic, polymeric, and polymer composite materials.

* * * * *